(12) United States Patent
Reinmuth et al.

(10) Patent No.: US 9,309,107 B2
(45) Date of Patent: Apr. 12, 2016

(54) MICROMECHANICAL SYSTEM AND CORRESPONDING MANUFACTURING METHOD

(75) Inventors: Jochen Reinmuth, Reutlingen (DE); Andreas Scheurle, Leonberg (DE); Christian Bierhoff, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 935 days.

(21) Appl. No.: 13/434,486

(22) Filed: Mar. 29, 2012

(65) Prior Publication Data

US 2012/0251799 A1    Oct. 4, 2012

(30) Foreign Application Priority Data

Mar. 30, 2011    (DE) .......................... 10 2011 006 403

(51) Int. Cl.
 *B32B 7/14*    (2006.01)
 *B81C 1/00*    (2006.01)
 *G01P 15/08*   (2006.01)

(52) U.S. Cl.
 CPC ......... *B81C 1/00039* (2013.01); *G01P 15/0802* (2013.01); *B81B 2207/07* (2013.01); *Y10T 428/24851* (2015.01)

(58) Field of Classification Search
 CPC .................................................. G01P 15/0802
 See application file for complete search history.

(56) References Cited

U.S. PATENT DOCUMENTS

2009/0152654 A1*  6/2009  Classen et al. ................ 257/415

FOREIGN PATENT DOCUMENTS

DE    10 2007 060 878    6/2009

* cited by examiner

*Primary Examiner* — Bruce H Hess
*Assistant Examiner* — Christopher Polley
(74) *Attorney, Agent, or Firm* — Kenyon & Kenyon LLP

(57) ABSTRACT

A micromechanical system is described having a substrate; a first micromechanical functional area, which is situated above the substrate; a second micromechanical functional area, which is situated above the first micromechanical functional area and is connected via a first weblike anchoring structure to the first micromechanical functional area; a third micromechanical functional area, which is situated above the second micromechanical functional area, and which has a first subarea and a second subarea; the first subarea being connected via a second weblike anchoring structure to the second micromechanical functional area; and the second subarea being mounted floating over the substrate by the first subarea. The invention also provides a method for manufacturing such a micromechanical system.

7 Claims, 11 Drawing Sheets

MICROMECHANICAL SYSTEM AND CORRESPONDING MANUFACTURING METHOD

RELATED APPLICATION INFORMATION

The present application claims priority to and the benefit of German patent application no. 10 2011 006 403.6, which was filed in Germany on Mar. 30, 2011, the disclosure of which is incorporated herein by reference.

FIELD OF THE INVENTION

The present invention relates to a micromechanical system and a corresponding manufacturing method, in particular for use in micromechanical acceleration sensors, yaw rate sensors, and the like.

BACKGROUND INFORMATION

Situating a thick polysilicon functional layer over a thin buried polysilicon layer is generally known for manufacturing MEMS structures. The buried polysilicon layer is used in this case as a printed conductor or an electrode. The polysilicon functional layer is typically exposed via a trenching process and a sacrificial layer etching method.

A micromechanical system and a corresponding manufacturing method are known from DE 10 2007 060 878 A1, a second buried polysilicon layer being provided, which may be exposed like the first polysilicon functional layer. This layer may be used as a printed conductor, so that, for example, printed conductor intersections are also possible as a printed conductor in combination with the first buried polysilicon layer. The second buried polysilicon layer may also be used as a mechanical freestanding layer. The three layers are separated by oxide layers, which are also used as sacrificial layers. The oxide layers define the distance between the individual layers and are designed to be relatively thick, depending on the application. If connections are applied between the layers, a tall topology is created on the surface, which makes it more difficult to manufacture structures at high resolution. The smaller the contact surfaces are designed, the less the influences by the elevated topography; however, the mechanical stability of the connection is thus simultaneously greatly reduced.

On the one hand, the oxide layers between the individual polysilicon layers may be intentionally used for mechanical reinforcement. On the other hand, mechanical tensions may occur due to the different mechanical parameters, however, which may also change with the temperature. Furthermore, depending on the geometry, it may be more or less difficult to completely remove the oxides between the polysilicon layers during the sacrificial layer etching process.

SUMMARY OF THE INVENTION

The exemplary embodiments and/or exemplary methods of the present invention provide a micromechanical system as described herein and a corresponding manufacturing method as described herein.

Further refinements are the subject matter of the further particular descriptions herein.

The exemplary embodiments and/or exemplary methods of the present invention have the advantage that it allows contact attachments, which are mechanically stable, to be manufactured on the substrate, a low topography to be produced simultaneously, also in the case of high sacrificial layer thicknesses, and above all a micromechanical system to be provided, which may avoid all undesirable oxide areas below the lowermost functional layer.

One aspect of the exemplary embodiments and/or exemplary methods of the present invention is not to produce a continuous planar connection between the functional layers, but rather to connect the functional layers to one another via weblike anchoring structures. These weblike anchoring structures may have a web ring structure and/or a web line structure of arbitrary geometry, for example. The width of the webs and their spaces are selected in such a way that, on the one hand, a stable mechanical connection may be achieved in consideration of the intended area of application and, on the other hand, reliable removal of the sacrificial layer from the spaces between the individual web sections may be ensured. The weblike anchoring structures may be designed as sufficiently narrow that a low topography forms on the surface of the web segments.

The first weblike anchoring structure between the first functional area of the first functional layer and the second functional area of the second functional layer and the second weblike anchoring structure between the second functional area of the second functional layer and the third functional area of the third functional area need have no overlap or only intersection-like overlaps. This has a very advantageous effect on the stability, since the topographies of the two contact planes only act marginally or not at all.

Two types of etching holes may be provided in the third functional area of the third functional layer. First etching holes are situated laterally offset on the second weblike anchoring structure and extend up to the third sacrificial layer. Second etching holes are situated over the second weblike anchoring structure and extend through the second weblike anchoring structure up to the second sacrificial layer. Depending on the process, it may prove to be favorable to design the second etching holes as wider than the weblike anchoring structure situated underneath, so that the third oxide layer virtually acts as a self-adjusting mask. By providing these two types of etching holes, both a tight arrangement of the web segments of the anchoring structures and also simultaneously a tight arrangement of the etching accesses may be achieved.

Narrow weblike anchoring structures may be used if the third functional area only receives slight polishing or no polishing or if in general a low topography is desirable or advantageous. Oblong second contact holes which extend perpendicularly to the web segments are particularly favorable, whereby process variations, such as adjustment errors, etching errors, etc., may be well compensated for.

Wide webs may be used if the third functional area experiences good, deep polishing or the topography plays a subordinate role. The second etching holes may then be situated inside the webs and are implemented as significantly narrower than the width of the webs, in order to thus also be able to compensate for processing variations.

Further features and advantages of the exemplary embodiments and/or exemplary methods of the present invention are explained hereafter on the basis of specific embodiments with reference to the figures.

DETAILED DESCRIPTION

Figure 1A:
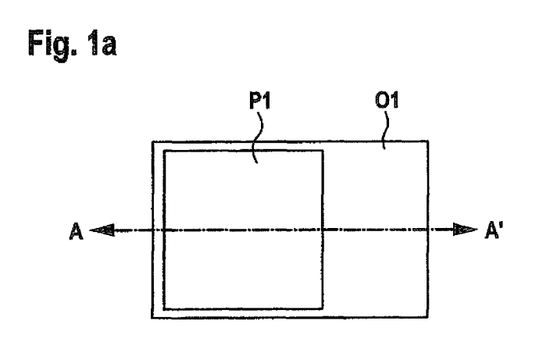
FIGS. 1a, 1b, 2a, 2b, 3a, 3b, 4a, 4b, 5a, 5b, 6a, and 6b show successive processing stages of a first specific embodiment of a method for manufacturing a micromechanical system according to the present invention, a) each in a top view and b) each in section along line AA' in a).
Figure 5A:
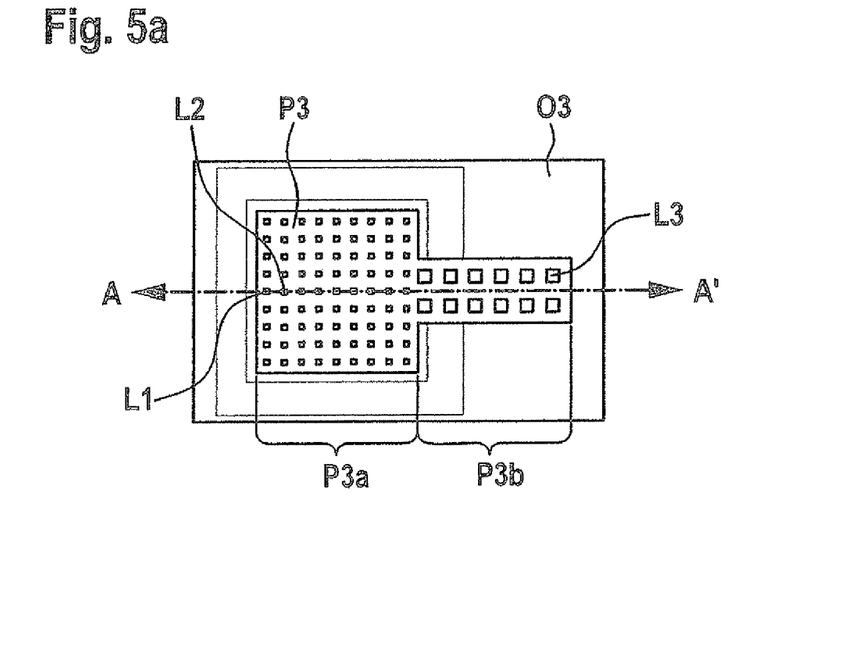
Figure 5B:
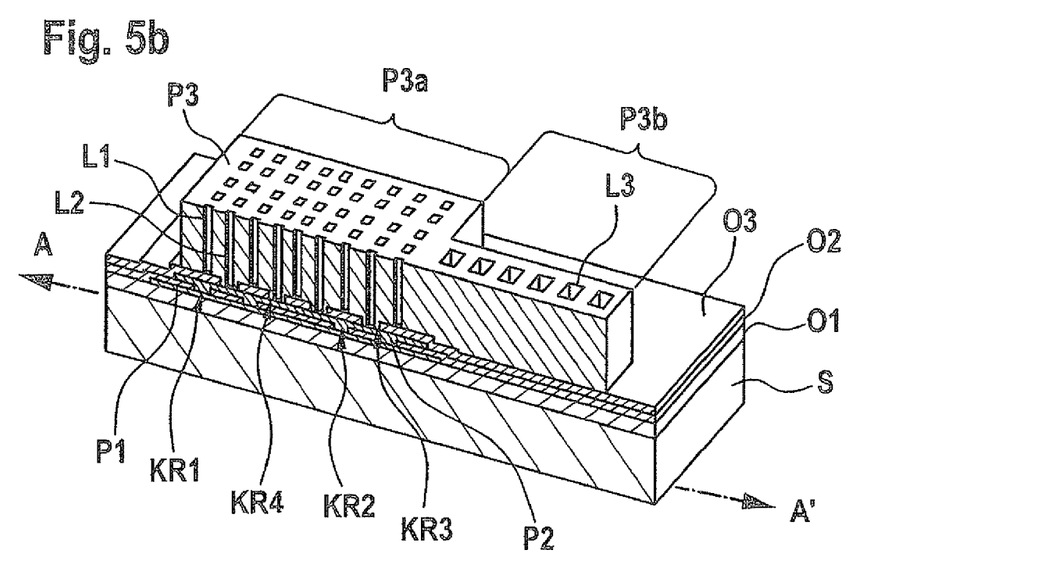
Figure 6A:
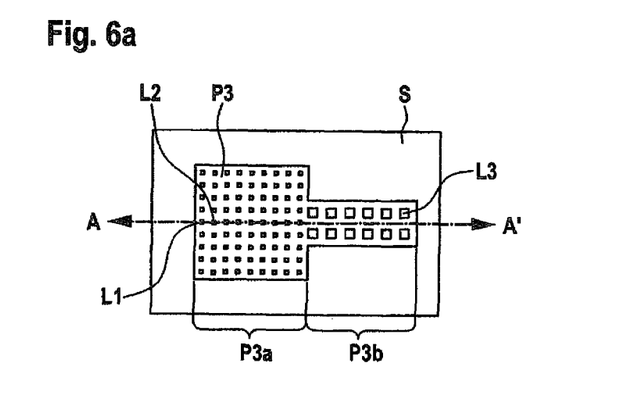

FIGS. 1a, b through FIGS. 6a, b show successive processing stages of a first specific embodiment of a method for manufacturing a micromechanical system according to the present invention, a) each in a top view and b) each in section along line AA' in a).

Figure 1B:
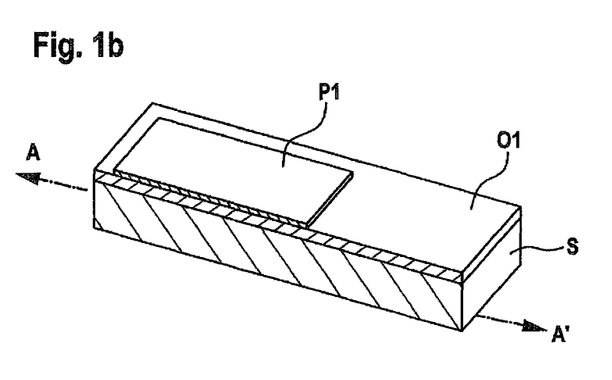

In FIG. 1, reference sign S identifies a silicon substrate, for example, a wafer substrate. A first sacrificial layer O1 made of oxide is provided by deposition, for example, on silicon substrate S. P1 identifies a first micromechanical functional area made of polysilicon, which has been structured on first sacrificial layer O1.

Figure 2A:
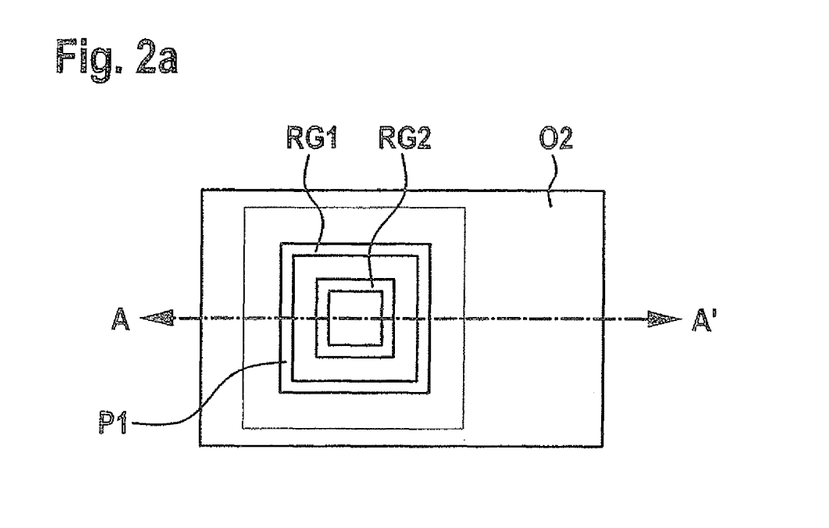
Figure 2B:
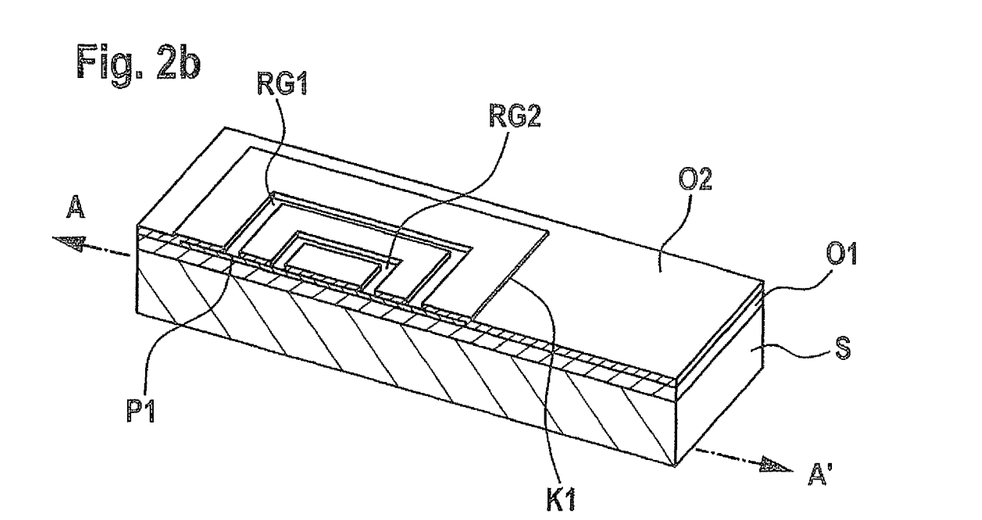

Furthermore, with reference to FIG. 2, a second sacrificial layer O2 made of oxide is deposited over first micromechanical functional area P1 and surrounding first sacrificial layer O1, which forms a step K1 on first micromechanical functional area P1.

Subsequently, a first weblike trench structure RG1, RG2 is formed in second sacrificial layer O2 over first micromechanical functional area P1, which exposes corresponding parts of first micromechanical functional area P1. In the first specific embodiment, first weblike trench structure RG1, RG2 has the form of ring trenches RG1, RG2, larger ring trench RG1 enclosing smaller ring trench RG2, having a distance situated between them and being spaced apart from the edges of first micromechanical functional area P1, the latter being shown in particular in FIG. 2b).

Figure 3A:
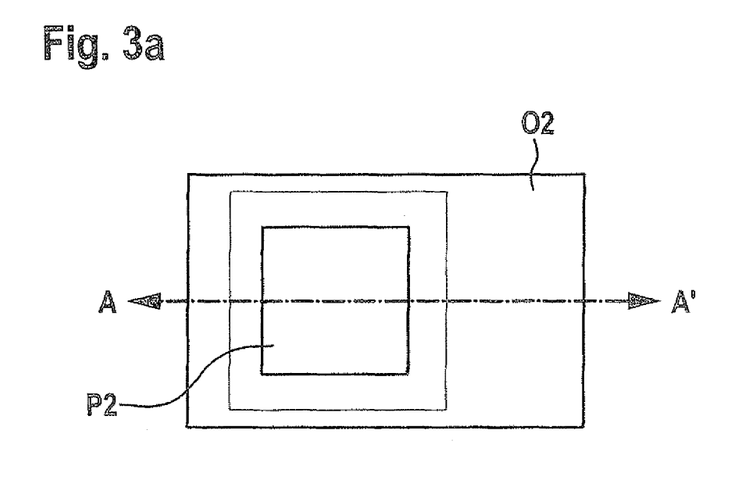
Figure 3B:
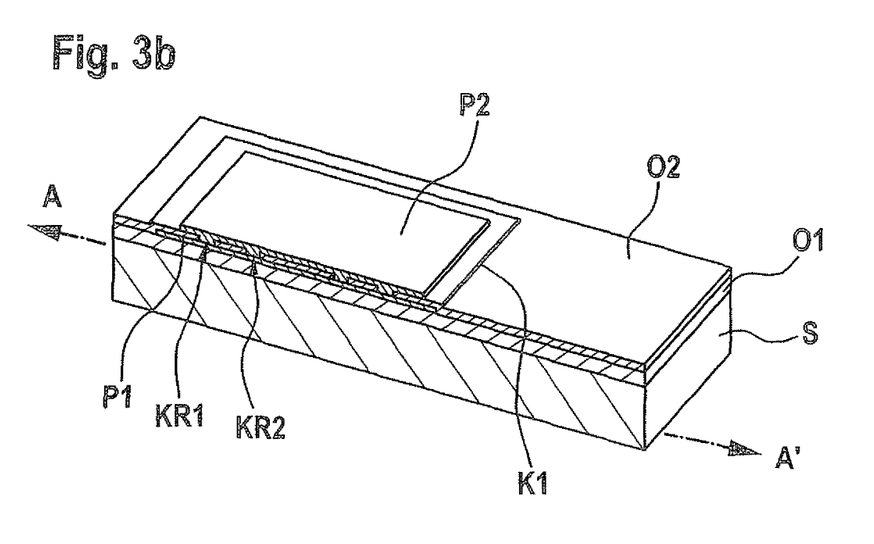

As shown in FIG. 3, a second micromechanical functional area P2 made of polysilicon is formed above first micromechanical functional area P1 on second sacrificial layer O2. A first weblike anchoring structure in the form of contact rings KR1, KR2, via which second micromechanical functional area P2 is connected to first micromechanical functional area P1, is created in first weblike trench structure RG1, RG2.

Contact rings KR1, KR2, which form the first weblike anchoring structure, are selected with respect to their web width and their distance or their number in accordance with the particular use and the intended stability. It is advantageous to select the thickness of first micromechanical functional area P1 made of polysilicon to be as thin as possible and to select the distance of first contact ring KR1 to oxide edge K1 of the second sacrificial layer to be as large as the layer thickness of first micromechanical functional area P1.

Figure 4A:
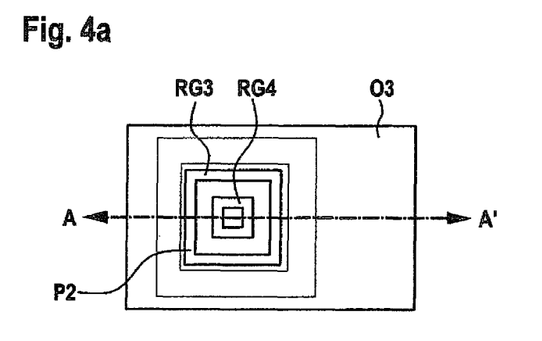
Figure 4B:
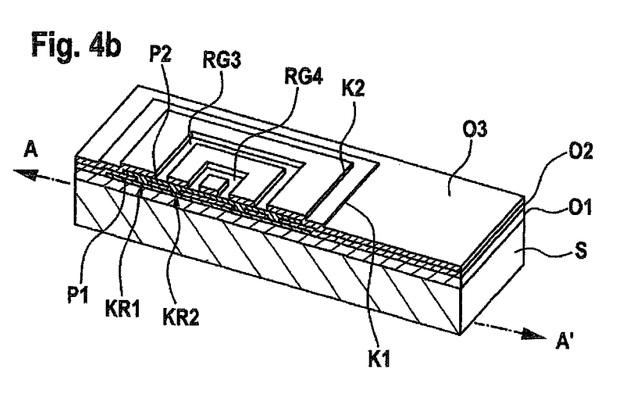

Furthermore, with reference to FIG. 4, a third sacrificial layer O3 is deposited on second micromechanical structure P2 and on surrounding second sacrificial layer O2 over the structure according to FIG. 3, which forms a step K2 on second micromechanical functional area P2.

Subsequently, a second weblike trench structure RG3, RG4 is formed in third sacrificial layer O3 above second micromechanical functional area P2, which exposes corresponding parts of second micromechanical functional area P2. Second weblike trench structure RG3, RG4 has a third ring trench RG3 and a fourth ring trench RG4, which are offset in relation to contact rings KR1, KR2 situated underneath and are nested, like first and second contact rings KR1, KR2.

The topologies of the two anchoring structures may be completely decoupled by this arrangement, since there are no overlaps.

Furthermore, with reference to FIG. 5, a third micromechanical structure P3 is formed on second sacrificial layer O2 above the structure according to FIG. 4, which has a first subarea P3a and a second subarea P3b, second subarea P3b being spaced apart laterally from the first and second weblike anchoring structures, and first and second micromechanical functional areas P1, P2 and being designed to be significantly narrower than first subarea P3a. Furthermore, third micromechanical functional area P3 made of polysilicon is substantially thicker than first and second micromechanical functional areas P1, P2.

During the manufacturing of third micromechanical functional area P3 by corresponding trench etching, corresponding first, second, and third etching holes L1, L2, L3 are also formed in third micromechanical functional area P3, first and second etching holes L1, L2 being formed in first subarea P3a, and third etching holes L3 being formed in second subarea P3b.

During the formation of third micromechanical functional area P3 on the second sacrificial layer, a second weblike anchoring structure KR3, KR4 is created in second weblike trench structure RG3, RG4, which has the form of contact rings KR3, KR4.

First etching holes L1 are situated laterally offset to second weblike anchoring structure KR3, KR4 in the form of contact rings KR3, KR4 and extend up to the top side of third sacrificial layer O3. Second etching holes L2 are situated directly over second weblike anchoring structure KR3, KR4, penetrate it, and extend up to the top side of second sacrificial layer O2. Second etching holes L2 have a narrower width than the web width of second weblike anchoring structure KR3, KR4. Third etching holes L3 penetrate second subarea P3b and end also on the top side of third sacrificial layer O3.

Figure 6B:
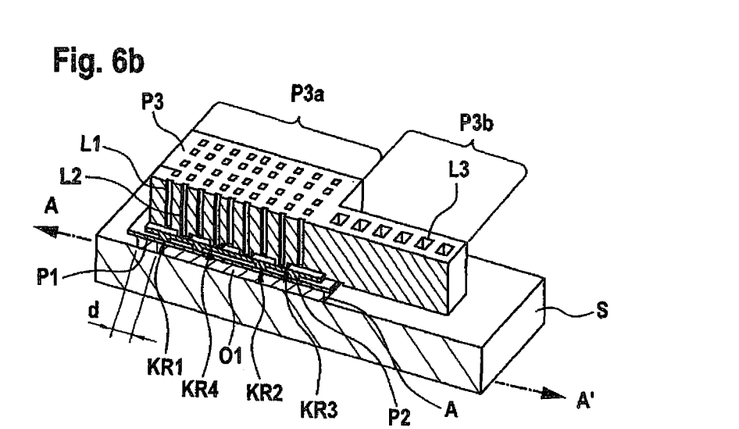

As shown in FIG. 6, sacrificial layer etching of first, second, and third sacrificial layers O1, O2, O3 is then performed, second and third sacrificial layers O2, O3 being completely removed. The latter is ensured in particular by the selected shape of the first and second etching holes in first subarea P3a. A part of first sacrificial layer O1 remains as an anchor of first micromechanical functional area P1 on silicon substrate S. It is advantageous to select a specific distance d of outer contact ring KR1 of the first weblike anchoring structure from a final outer edge A of remaining first sacrificial layer O1, as indicated in FIG. 6, in order to avoid tensions in this area.

Second subarea P3b of third micromechanical functional area P3 is mounted floating over silicon substrate S after the sacrificial layer etching over first subarea P3a. Such a structure may be used, for example, as a bending bar structure in an acceleration sensor or yaw rate sensor or similar sensors.

The described manufacturing method allows a mechanically robust suspension, which is distinguished in particular in that it has no predeflection and the deflection is also not influenced via temperature or other external influences, e.g., water accumulation in the oxide. The suspensions only have a low topography and may be implemented well in existing processes.

Figure 7A:
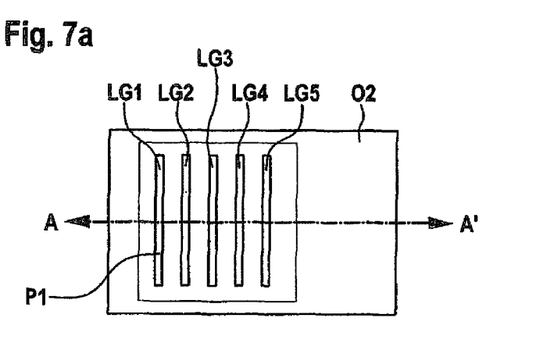
FIGS. 7a, 7b, 8a, 8b, 9a, 9b, 10a, 10b, 11a, and 11b show successive processing stages of a second specific embodiment of a method for manufacturing a micromechanical system according to the present invention, a) each in a top view and b) each in section along line AA' in a).
Figure 10A:
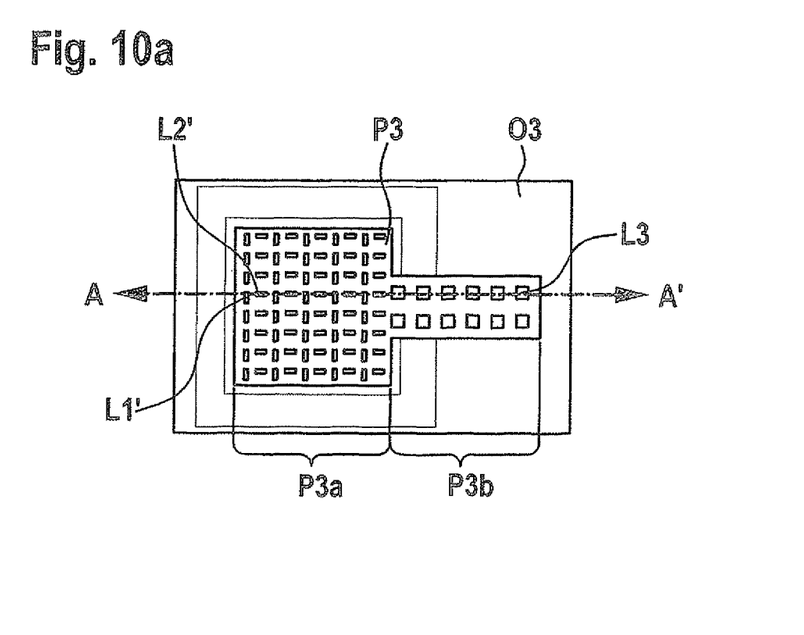
Figure 10B:
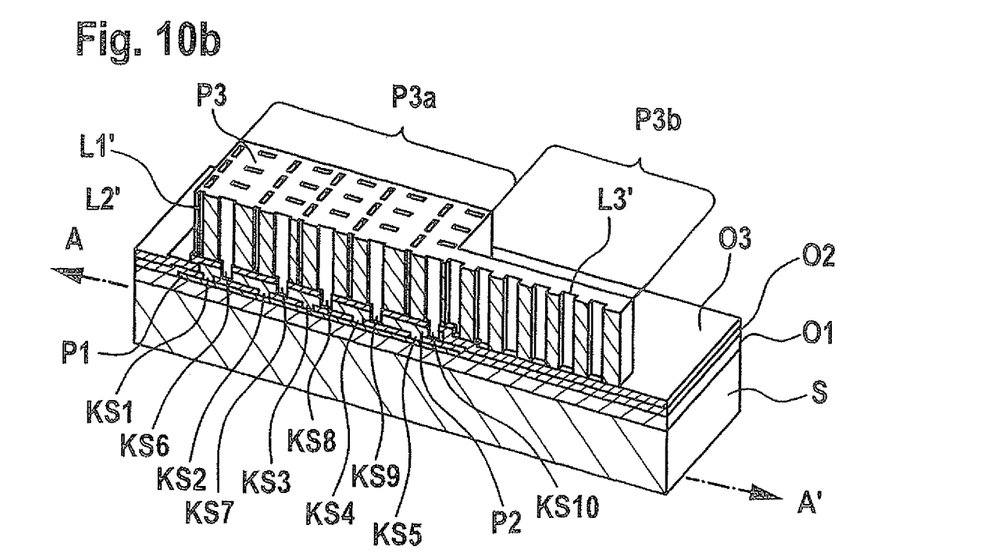
Figure 11A:
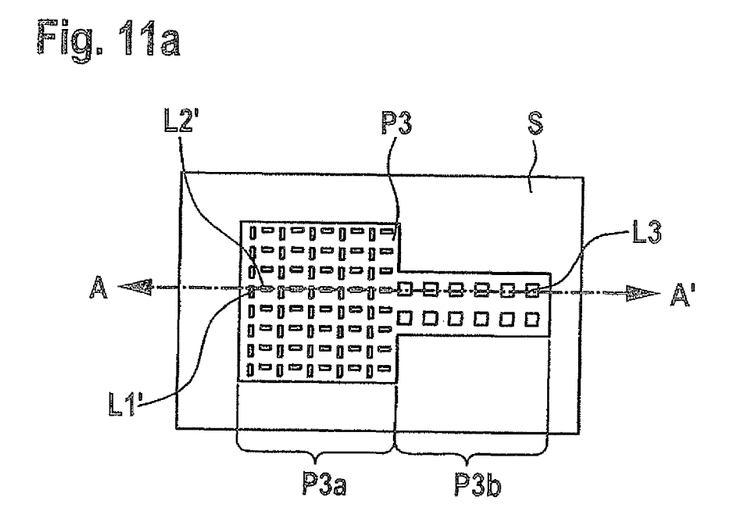

FIGS. 7a, b through FIGS. 11a, b show successive processing stages of a second specific embodiment of a method for manufacturing a micromechanical system according to the present invention, a) each in a top view and b) each in section along line AA' in a).

Figure 7B:
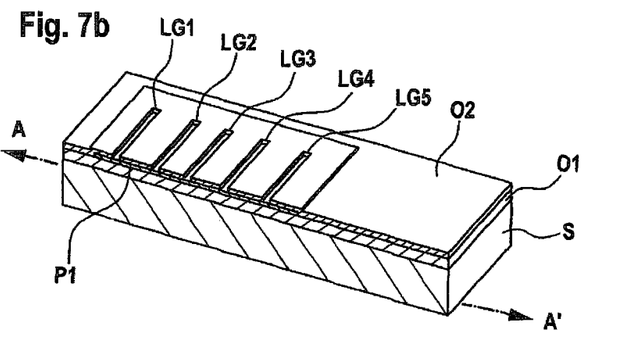

The view in FIG. 7 corresponds to the view in FIG. 2 in this second specific embodiment, the first weblike trench structure having line trenches LG1, LG2, LG3, LG4, LG5, which are situated in parallel and spaced apart from one another over first micromechanical functional area P1 and expose corresponding parts thereof. Otherwise, the processing state according to FIG. 7 corresponds to the processing state according to FIG. 2.

Figure 8A:
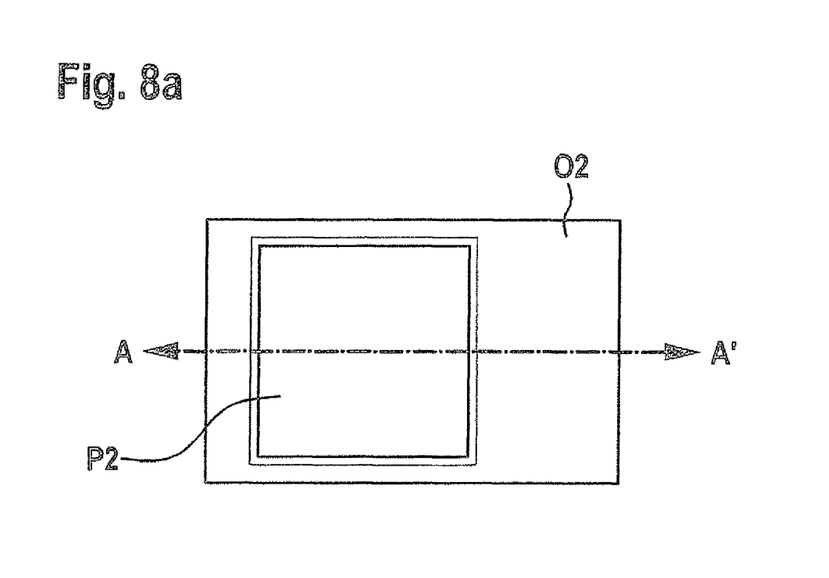
Figure 8B:
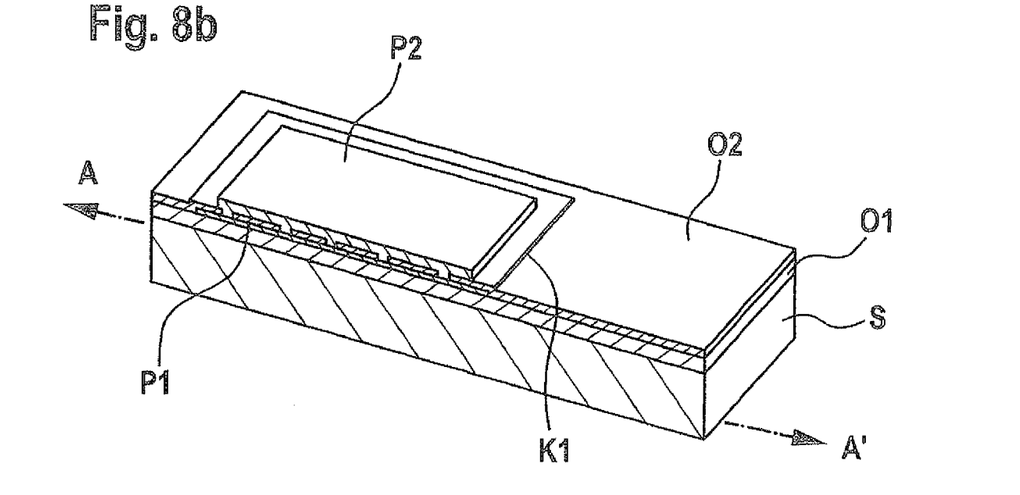

Furthermore, with reference to FIG. 8, which corresponds to FIG. 3 of the first specific embodiment, a first weblike anchoring structure KS1, KS2, KS3, KS4, KS5 in line trenches LG1, LG2, LG3, LG4, LG5 of the first weblike trench structure in the form of linear webs is created through the formation of second micromechanical functional area P2, the linear webs also being spaced apart from oxide edge K1 or the lateral edge of first micromechanical functional area P1.

Figure 9A:
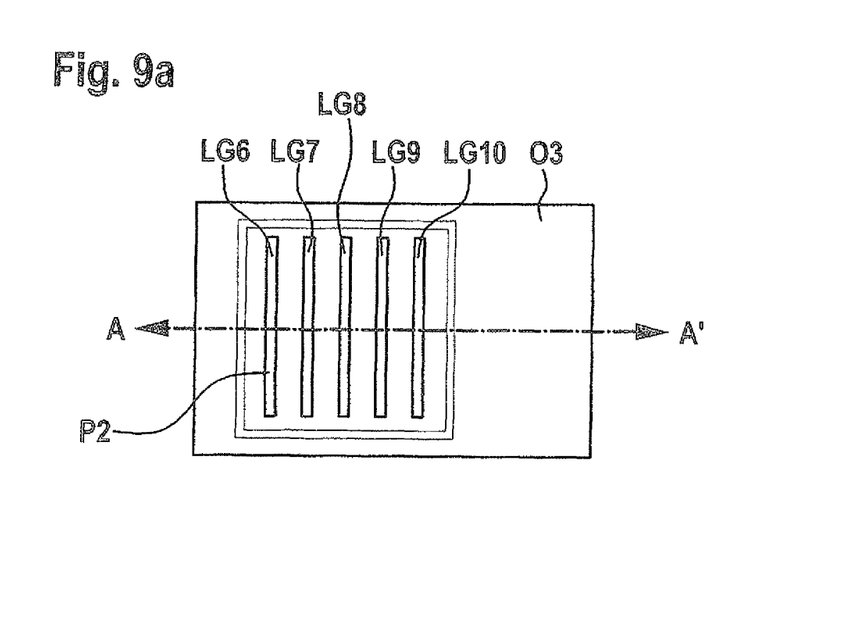
Figure 9B:
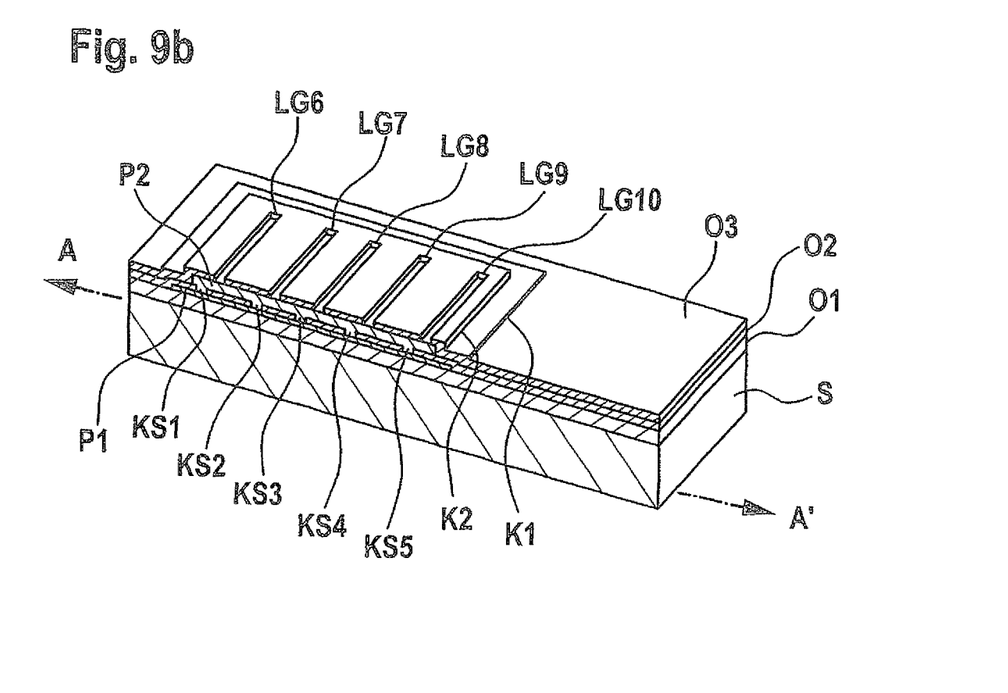

According to FIG. 9, which is similar to FIG. 4, a third sacrificial layer O3 made of oxide is deposited over the structure according to FIG. 8 and a second weblike trench structure is structured therein in the form of parallel line trenches LG6, LG7, LG8, LG9, LG10, line trenches LG6 through LG10 being situated above the spaces of contact webs KS1 through KS5, so that they do not overlap. The corresponding anchoring structures are therefore also decoupled from one another.

Furthermore, with reference to FIG. 10, which identifies the processing state similar to FIG. 6, third micromechanical functional area P3 is formed from polysilicon and structured, second weblike anchoring structure KS6, KS7, KS8, KS9, KS10 being formed in the second weblike trench structure.

In this second specific embodiment, first, second, and third etching holes L1', L2', and L3' are also formed in third micromechanical functional area P3, which has subareas P3a and P3b.

First and second etching holes L1', L2' are formed in subarea P3a, the first etching holes being formed laterally offset to second weblike anchoring structure KS6 through KS10 and extending up to the top side of third sacrificial layer O3, and the second etching holes being situated over second weblike anchoring structure KS6 through KS10 and thereby extending up to the top side of second sacrificial layer O2.

In contrast to the first example, first and second etching holes L1', L2' have an oblong shape, second etching holes L2' having a greater longitudinal width than contact webs KS6 through KS10 of the second weblike anchoring structure, which are situated underneath. Self-adjustment may thus be achieved.

Third etching holes L3' in second subarea P3b correspond to etching holes L3, which were already explained above in connection with the first specific embodiment.

Figure 11B:
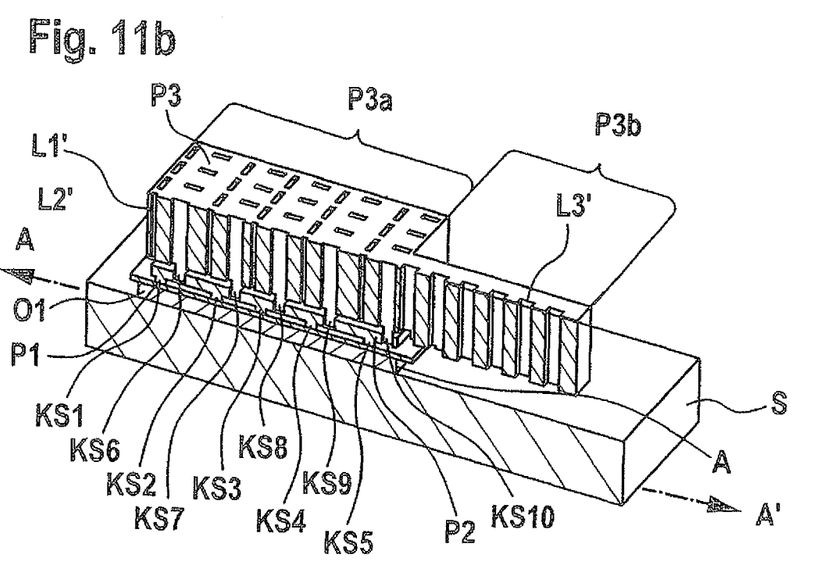

To achieve the final state according to FIG. 11, which corresponds to FIG. 6, the mentioned sacrificial layer etching is performed, second and third sacrificial layers O2, O3 being completely removed, and a part of first sacrificial layer O1 remaining as the anchor of first micromechanical functional area P1 on silicon substrate S. Reference sign d' identifies the preferred distance of outermost webs KS1, KS5 from outer edge A' of the remaining residue of first sacrificial layer O1 in FIG. 11b).

With the exception of the different design of the particular first and second weblike anchoring structures, the micromechanical system according to FIG. 11 is configured identically to the micromechanical system according to FIG. 6 and may be used as a bending bar in an acceleration sensor or a yaw rate sensor or a similar sensor, for example.

Although the exemplary embodiments and/or exemplary methods of the present invention was explained above on the basis of two exemplary embodiments, it is not restricted thereto, but rather is variable in manifold ways.

In particular, the web widths and geometries of the first and second anchoring structures are variable specifically for the application and are not restricted to the ring shape or line shape shown. The distances between the webs or web segments may also be varied depending on the application. Furthermore, the mentioned layer materials for the sacrificial layers and the functional layers are not restricted to the mentioned materials.

What is claimed is:

1. A micromechanical system, comprising:
 a substrate;
 a first micromechanical functional area, which is situated above the substrate;
 a second micromechanical functional area, which is situated above the first micromechanical functional area and is connected via a first weblike anchoring structure to the first micromechanical functional area; and
 a third micromechanical functional area, which is situated above the second micromechanical functional area and which has a first subarea and a second subarea;
 wherein the first subarea is connected via a second weblike anchoring structure to the second micromechanical functional area,
 wherein the second subarea is mounted floating over the substrate by the first subarea,
 wherein the first weblike anchoring structure and the second micromechanical functional area are made of the same material, and
 wherein the second weblike anchoring structure and the third micromechanical functional area are made of the same material.

2. The micromechanical system of claim 1, wherein the first weblike anchoring structure has at least one of a first web ring structure and a first parallel lined structure.

3. The micromechanical system of claim 1, wherein the second weblike anchoring structure has at least one of a second web ring structure and a second parallel lined structure.

4. The micromechanical system of claim 1, wherein the first weblike anchoring structure and the second weblike anchoring structure have no overlap.

5. The micromechanical system of claim 1, wherein the first weblike anchoring structure and the second weblike anchoring structure only have overlaps along one or more edges.

6. The micromechanical system of claim 1, wherein the first, second, and third micromechanical functional areas are polysilicon areas.

7. The micromechanical system of claim 6, wherein the first micromechanical functional area is connected via a first oxide layer to the substrate and the first weblike anchoring structure has a distance to an outer edge of the first oxide layer.

* * * * *